United States Patent [19]

Meggs

[11] Patent Number: 4,530,033
[45] Date of Patent: Jul. 16, 1985

[54] CARD FRAME FOR CIRCUIT CARDS

[75] Inventor: Jean-Pierre Meggs, Bondy, France

[73] Assignee: Transrack, Saint-Maur-des-Fosses, France

[21] Appl. No.: 464,880

[22] Filed: Feb. 8, 1983

[30] Foreign Application Priority Data

Feb. 16, 1982 [FR] France .................. 82 02509

[51] Int. Cl.³ .............................................. H05K 7/14
[52] U.S. Cl. ................................................ 361/415
[58] Field of Search ............... 361/415, 429, 390, 391,
361/399; 211/41, 189, 182, 206; 312/108, 111,
140, 211, 263, 264; 403/245, 246, 353, 405,
DIG. 10; 29/453, 462, 463

[56] References Cited

U.S. PATENT DOCUMENTS

| | | | |
|---|---|---|---|
| 3,409,858 | 11/1968 | Krehbiel | 403/329 X |
| 3,733,523 | 5/1973 | Reynolds et al. | |
| 3,851,435 | 12/1974 | Roberts et al. | 211/189 X |
| 4,232,356 | 11/1980 | Saunders et al. | 361/415 |
| 4,422,212 | 12/1983 | Sheiman et al. | 403/329 X |

FOREIGN PATENT DOCUMENTS 1461268 10/1966 France .
422102 4/1967 Switzerland .

OTHER PUBLICATIONS

"Card Retention Clip"—IBM Tech. Disclos. Bull., vol. 23, No. 11, Apr. 1981.

Primary Examiner—Vit W. Miska
Attorney, Agent, or Firm—Sandler & Greenblum

[57] ABSTRACT

A circuit card frame comprising one-piece molded panels and sidewalls. The panels have U-shaped tenons adapted to be inserted in openings in the sidewalls and slid into place along locating tongues and ridges disposed in the openings. The panels have elastic tongues adapted to be deflected along ramps disposed between pairs of tenons at the ends of the panels when the panels are slid into place, the free edge of the elastic tongues abutting an end of the ramps to lock the panels on the sidewalls. A mounting clip may be provided for holding a mothercard to a panel.

22 Claims, 6 Drawing Figures

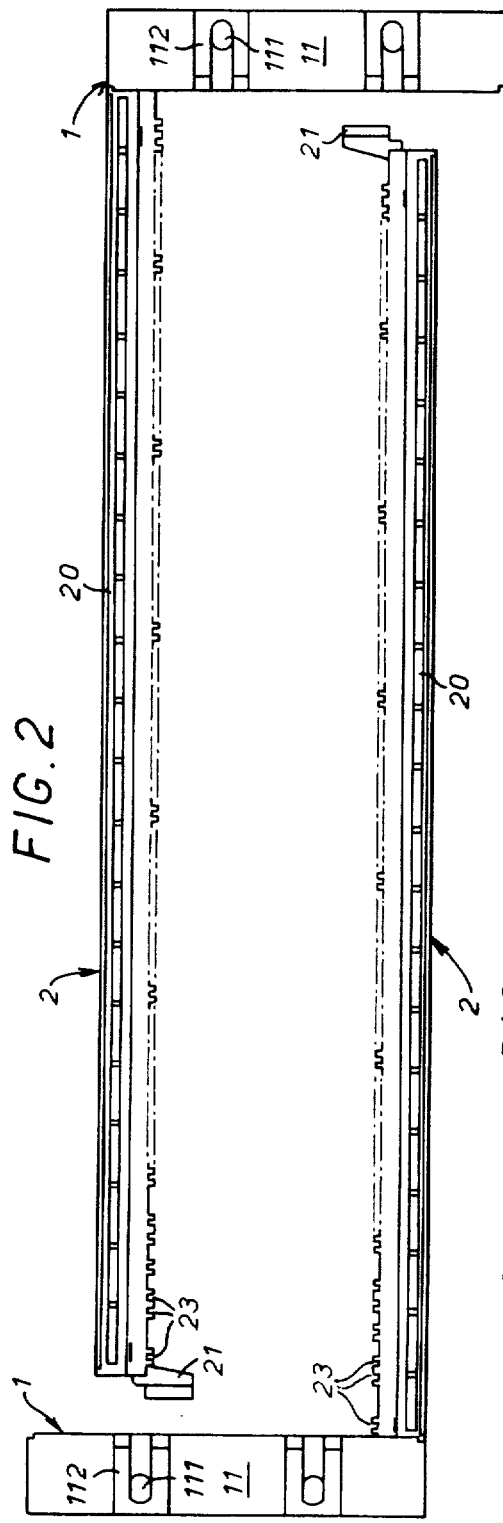
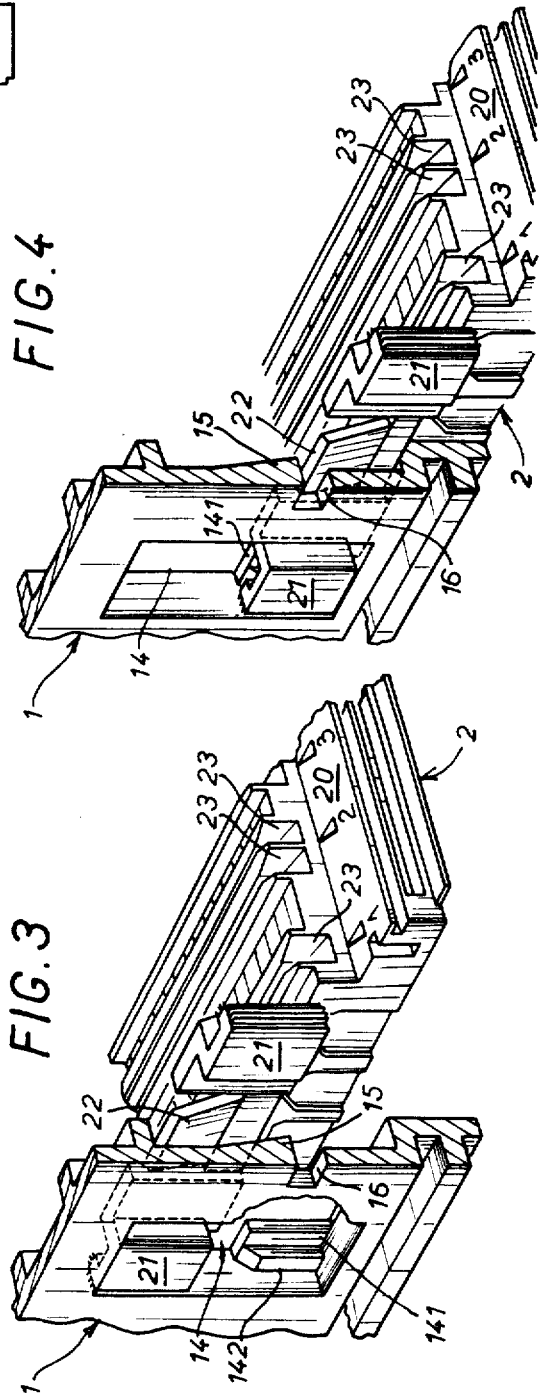
FIG. 2
FIG. 3
FIG. 4

CARD FRAME FOR CIRCUIT CARDS

BACKGROUND OF THE INVENTION

The present invention relates to a card frame for housing circuit cards, in particular, printed circuit cards.

Such card frames are known comprising a set of separate components which may be assembled to form the desired size and configuration adapted to receive a particular type of circuit card. Such known frames are assembled by means of threaded fasteners and the accommodation of a particular circuit card involves the mounting of additional accessories which is often a time-consuming and meticulous procedure and, therefore, costly.

Card frames are also known which are made of one-piece molded plastic material and have the drawback of being limited to only set applications and card sizes, and the different sized card frames therefore require considerable storage facilities.

DESCRIPTION OF PRIOR ART

French Patent No. 1,461,268 corresponding to U.S. Ser. No. 422,791, filed Dec. 31, 1964, discloses a card frame for printed circuit cards comprising terminal plates and bars of composite structure, which are assembled by foldable lugs or expandable fasteners. Assembly of the terminal plates and bars is therefore a relatively complicated and time-consuming procedure.

Swiss patent No. 422,102 discloses a frame for electrical equipment comprising molded sidewalls and longitudinal buses which are devoid of grooves for housing circuit cards. The buses are secured to the sidewalls by threaded fasteners.

U.S. Pat. No. 3,733,523 teaches an electronic circuit card cage utilizing upper and lower panels which are assembled to one another by threaded fasteners.

SUMMARY OF THE INVENTION

According to the invention there is provided a circuit card frame which is easy to assembly and accommodates a large variety of circuit cards without the need of accessories.

According to the invention there is also provided a card frame for housing circuit cards, in particular, printed circuit cards, the card frame comprising a plurality of molded sidewalls and a plurality of molded panels having means for receiving circuit cards, means for assembling said sidewalls and panels together including first joint and lock means integral with the panels and second joint and lock means integral with the sidewalls, the first and second joint and lock means being cooperable with one another for interengaging the sidewalls and panels and locking them into position.

According to a feature of the invention the means for receiving circuit cards comprises at least two series of card guides integral with each of the panels. Preferably, the spacing between the integral card guides of each series is different.

These and other features will be brought out in the description which follows, given by way of example, and illustrated in the accompanying drawings.

BRIEF DESCRIPTION OF THE DRAWINGS

FIG. 2 shows a front elevational view of the card frame of FIG. 1, in which each of the panels is assembled with one of the sidewalls;

FIG. 3 shows a partially cutaway fragmentary perspective view illustrating the joint and lock means being brought into position;

FIG. 4 shows a view similar to that of FIG. 3 wherein the joint and lock means are in the locked position;

DESCRIPTION OF THE PREFERRED EMBODIMENT

Figure 1:
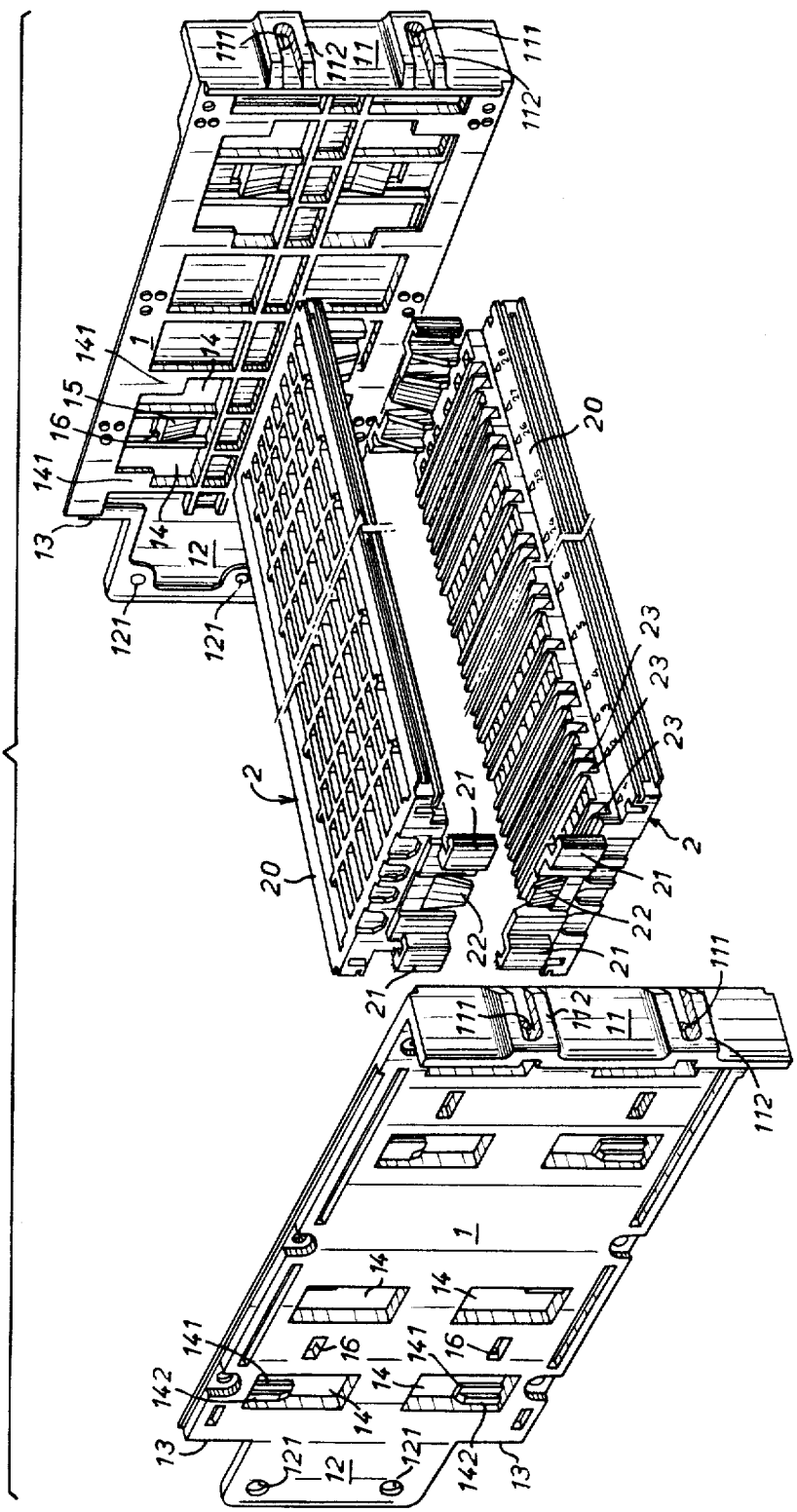
FIG. 1 shows an exploded perspective view of a card frame having two sidewalls and two panels.

The card frame or cage of the invention comprises two sidewalls 1 and four shelves or panels 2 for assembly with the sidewalls, only two of the panels being shown in the accompanying drawings for the sake of clarity.

The two sidewalls 1 are of identical one-piece molded plastic construction. The sidewalls 1 are arranged parallel to each other and symmetrically with respect to a vertical plane of symmetry. The sidewalls 1 are designed to be mounted either in cabinets or racks in the same way as in conventional card frames.

The four panels 2 are of identical molded plastic construction. They are arranged in pairs to lie over and parallel to one another, and symmetrically with respect to a horizontal line of symmetry. The panels 2 have integral card guides of variable spacing along the length of the panels.

Such card frames, once assembled, comply with French standard N.F.C. 20150 and German standard D.I.N. 41494, CEI 297 publication, under the auspicies of Committee 48D on mechanical assemblies for housing printed circuits having international mechanical dimensions 100 mm × 220 mm, 100 mm × 280 mm, 233.4 mm × 160 mm, 233.4 mm × 220 mm, 233. 4 mm × 280 mm. They are provided in several different heights, for example, from 2U to 6U (where U represents the rack unit of 44.45 mm). If the height is relatively great (e.g. 6U), a rear brace is recommended. For the necessary connections the card frame may also comprise a mothercard, a rear card or connector carrier buses and mounting clips (not illustrated in FIGS. 1-4).

Generally speaking, a feature of this card frame, which is in conformity with European standards, is sidewalls and panels comprising joint and lock means for easy and reliable interengagement and locking. The molded plastic sidewalls and panels are made, for example, by injection molding thermoplastic material, or by die casting metal such as a zinc or, aluminum alloy. When the sidewalls or the panels are made of plastic material, they may be glass fiber reinforced, and are preferably self-extinguishable.

The sidewalls may comprise conventional assembly means such as threaded fasteners for assembly to conventional racks.

Each sidewall 1, of one-piece construction, has a front flange 11 at 90° so that the sidewall has an overall L-shaped section. Flange 11 has apertures 111, two or four along its height, for fastening the card frame or cage to racks or cabinets in accordance with international standards. The apertures 111 are surrounded by sideways opening bosses 112 for bearing against the front wall (not shown) of the rack or cabinet.

The width of the flanges 11 and the length of the panels 2 provides an overall width of the front side of the frame or cage of $$482.6 \text{ mm} \begin{array}{c} +0.4 \\ -0.0. \end{array}$$

At the rear of the sidewalls 1 are formed lugs 12 which lie in the continuation of the general plane of the sidewalls, beyond a connecting plane defined by the location of the frame or cage connectors, in the vicinity of the plane of the edges 13 of the sidewalls 1 facing rearwardly, as illustrated.

Thus the connectors are protected during handling of the card frame or cage outside the rack or cabinet, in particular, when they are in an upright position for servicing.

The lugs 12 also permit the mounting of an accessory carrier by means of threaded fasteners extending through holes 121.

The sidewalls 1 and panels 2 are assembled by interengagement. The sidewalls each have an upper and lower row of rectangular openings 14 for receiving the ends of the panels 2, and more particularly the tenons or first joint components 21 as will be brought out below. In the illustrated embodiment where a single horizontal row of vertical cards is provided, there are only two horizontal rows of openings, but as a general rule, there are as many pairs of horizontal rows of openings as there are levels of cards.

At one of the corners the openings 14 have a rigid locating tongue or second joint component, the height and width of the tongues being slightly less than half the height and width of the corresponding opening 14. The locating tongue or second joint component 141 has a ridge 142 with a tapered free end which facilitates the insertion of the tenon 21 on the ridge 142. Since each row or level of cards corresponds to at least one upper and one lower panel, the lower row of openings 14 have their locating tongues 141 at their lower (left hand) corner and the upper row of openings 14 have their locating tongues 141 at their upper (left hand) corner.

The joint and lock means assembling the sidewalls and panels together also lock the pairs of first and second joint components against movement, namely, rotation. To this end, inclined cam surfaces or ramps 15 are provided on the inner face of the sidewalls 1 for cooperation with elastic or resilient tongues at the ends of the panels 2, between the tenons 21. Frangible zones 16 are provided immediately beyond the cam surfaces 15, at the free end thereof. The frangible zones 16 are defined by thin films or zones which are broken in the drawings and their function will be described below.

The sidewalls 1 also comprise countersunk holes for mounting the sidewalls on conventional racks by means of threaded fasteners. The sidewalls or other sections are of aluminum so as to define a card frame of different materials.

The one-piece panels 2 comprise a base 20; depending from the ends of the base 20 are the tenons 21 and elastic tongues 22. The tenons 21 are generally at right angles to the base of the panels, and extend downwardly from the upper panel 2 and upwardly from the lower panel 2. The height of tenons 21 must be short enough to permit insertion into the openings 14 above or below the locating tongues 141, depending on their orientation. The tenons 21 are U-shaped in horizontal cross-section; the outer surface of the bight portion of each U-shaped tenon 21 defines the endmost surface of panels 2. The distance from the edge of the free leg of each U-shaped tenon 21 from the base of the panel 2 is greater than the thickness of the locating tongues 141 plus the thickness of the ridge 142. Accordingly, the rigid tongues 141 and the ridges 142 thereon may be inserted between the tenons 21 and the base 20 of the associated panel 2 for vertical guiding movement of the panel 2 with respect to the sidewalls 1. Obviously the spacing between the tenons 21 at the end of the panels 2 is equal to that of the openings 14 in the sidewalls 1.

The elastic tongues 22 are joined at one end to their panel base 20 and they are inclined outwardly to their free end so that the free ends of the elastic tongues 22 of each panel are farther apart than their ends attached to the panel base 2. The length of the elastic tongues 22 is such that once the panels are in position in the sidewalls the free ends of the elastic tongues 22 are in abutment with the ends of the ramps 15 for locking the panels in position.

Parallel grooves or guides 23 extending transversely of the panel bases along the entire width of the panels and integral therewith are provided for guiding circuit cards vertically between superposed panels.

For permitting a choice of spacing between circuit cards, there are a first series of grooves having a first spacing and at least a second series of grooves having a second spacing. Insofar as there is a unitary spacing value between circuit cards, a good solution consists in selecting the spacing between the grooves of each of the first and second series as a multiple of this unitary spacing value, the multiple being a low number, less than, say, 10. Thus with a multiple of 3 and 4, if the origin or reference groove is an endmost groove, the grooves of the first series will be located at the following positions : 0, 3, 6, 9, 12, 15 . . . and the grooves of the second series will be located at the following positions: 0, 4, 8, 12, 16 . . . and therefore there will be a groove at each of the following positions: 0, 3, 4, 6, 8, 9, 12, 15, 16 . . . with grooves at the positions 0, 12, 24 being common to both series. The spacing between common grooves being a function of their lowest common multiple.

Conventionally the absolute unitary spacing value is 5.08 mm and therefore grooves will be provided at the following positions: 0 mm, 15.24 mm, 20.32 mm, 30.48 mm, 40,64 mm, 45.72 mm, 60.96 mm . . . Accordingly the spacing between common grooves of the two series is therefore 60.96 mm.

In this embodiment the effective length of the panels is 84 times 5.08 mm or 426.72 mm, or 7 times the spacing between grooves common to both series or 60.96, corresponding to a spacing between the first series of grooves of 15.24 and a spacing between the second series of grooves of 20.32 mm.

The circuit cards may be positioned at regular distances from one another or at the most suitable distances.

The electronic components and accessories that have to be mounted in the card frames are at different locations along the panels 2 and their connection may be effected according to various spacings, the arrangement of the grooves augments the versatility of the equipment while maintaining a perforate surface which is compatible with ventilation requirements.

On each panel are provided housings for strip markers or tags for indicating the position of circuit cards.

From the practical standpoint, as there are various types of circuit cards it is possible to provide arrangements for 160 mm, 220 mm, 280 mm card lengths. In order to adapt the card frame intended for a given card size to a smaller card size, additional joint and lock means are recommended which are offset 60 mm or even 120 mm, or some other configuration for the desired positioning.

The assembly of the card frame, and more particularly the assembly of each panel 2 with a sidewall 1 comprises inserting tenons 21 on the panel 2 into selected openings 14 and sliding the tenons 21 onto and along the rigid locating tongues 141 and the ridges 142. During the sliding of the tenons 21 along the locating tongues 141 and ridges 142, the elastic tongue 22 is deflected by the corresponding ramp 15. Once the tenons 21 are fully engaged on their associated locating tongues 141 and ridges 142, the elastic tongue 22 snaps back to its initial or rest position and the panel 2 is locked into place by the abutment of the free edge of the elastic tongue 22 against the shoulder at the free end of the ramp.

The panel may be unlocked by piercing the frangible zones 16 by means of hand tool such as a screwdriver. It is then possible to disengage the panel by pressing the elastic tongue 22 while slidingly retracting the tenons 21 along the locating tongues 141 and ridges 142 into the free zone of the associated openings 14.

The connectors for the circuit cards may be mounted, as is conventional, with buses carrying connectors or a mothercard or a rear card.

Figure 5:
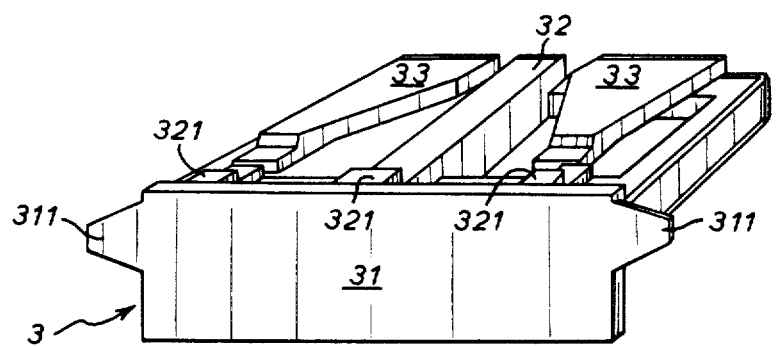
FIG. 5 shows a perspective view of a mounting clip for the card frame of the invention.
Figure 6:
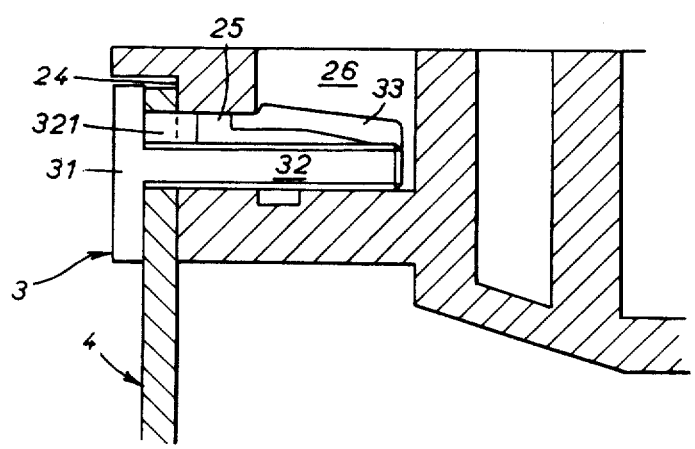
FIG. 6 is a cross-sectional view of the mounting clip in position on a panel of the card frame.

The mothercard, the rear card or the connector buses may be screwed to the rear edge of the panels, at the back of the card frame, by means of honeycomb cavities provided for this purpose, or by means of mounting clips 3 (see FIG. 5) preferably made of plastic and engaged in a groove 24 formed in the longitudinal edges of panels 2 (FIG. 6).

Accessories for limiting the front edges of the circuit cards may also be accommodated in cavities in the edges of the panels.

The mounting clips 3 for the mothercard, the rear card or the connector buses are of one-piece molded plastic construction, essentially comprising a front wall 31 having flexible inwardly angled lateral wings 311 for butting up against the mothercard, compensating for the size of the front wall. The front wall 31 is connected to a body 32 having limit stops 321; integral leaf spring members 33 are hinged on the body 32 at the end thereof opposite the front wall 31.

The mounting clips 3 are adapted to be inserted into channels opening into the grooves 24 provided in the rear edges of the panels 2, the mothercard 4 being held against the mounting clips and the bottom of the grooves 24. The widened part 26 of the channel 25 permits the return of the leaf spring members 33 toward their rest position. Since the widened part 26 of each channel 25 opens onto the face of the panel base, the leaf spring members 33 may be depressed to release them and remove the mounting clip 3 from the channel 25 in order to change the circuit card.

These mounting clips 3 provide very simple mounting since after the connector buses, mothercard, rear card or other connector accessory is brought into contact with the longitudinal groove of the selected panel, the mounting clip 3 is pushed into the associated channel 25. The leaf spring members 33 traverse perforations in the connector accessory, remaining depressed until fully inserted. At the end of insertion the leaf spring members 33 are free to swing into the widened part 26 of channel 25 so as to come into abutment with the connecting zone or corner between the channel 25 and the widened part 26, thereby securing the accessory in place. The wings 311 compensate for play by exerting force against the mothercard 4.

The clip 3 may be removed by depressing the leaf spring members 33 by means of a screwdriver inserted through the widened part 26 of channel 25.

The present invention is not intended to be limited to the illustrated and described embodiment but admits of various alternatives and modifications understood to those skilled in the art without departing from the spirit and scope of the invention.

What is claimed is:

1. A card frame for circuit cards, said card frame comprising two sidewalls and at least one pair of panels, said sidewalls and said at least one pair of panels being separate molded components, and means for assembling and disassembling said sidewalls and panels together comprising a first joint and lock means integral with said panels and a second joint and lock means integral with said sidewalls, said first and second joint and lock means being cooperable with each other for interengaging and locking in place said sidewalls and panels, each of said sidewalls further comprising means for receiving a tool to be inserted through each said sidewall for unlocking and disengaging said sidewalls from said panels.

2. The card frame of claim 1, wherein said panels are of one-piece construction.

3. A card frame for circuit cards, said card frame comprising two sidewalls and at least one pair of panels, said sidewalls and at least one pair of panels being separate molded components, and means for assembling said sidewalls and panels together comprising a first joint and lock means integral with said panels and a second joint and lock means integral with said sidewalls, said first and second joint and lock means being cooperable with each other for interengaging and locking in place said sidewalls and panels, wherein each of said panels comprises a first and second series of circuit card guide means integral therewith, the spacing between said circuit card guide means of said first series being different from the spacing between the circuit card guide means of said second series.

4. The card frame of claim 1, wherein one of said joint and lock means comprises an opening and a joint component, the other of said joint and lock means comprises a cooperable joint component which is adapted to be inserted into said opening and slid along the first mentioned joint component to a fully engaged position.

5. The card frame of claim 4, wherein said one of said joint and lock means is said second joint and lock means and said other joint and lock means is said first joint and lock means.

6. A card frame for circuit cards, said card frame comprising two sidewalls and at least one pair of panels, said sidewalls and said at least one pair of panels being separate molded components, and means for assembling said sidewalls and panels together comprising a first joint and lock means integral with said panels and a second joint and lock means integral with said sidewalls, said first and second joint and lock means being cooperable with each other for interengaging and locking in place said sidewalls and panels, wherein one of said joint and lock means comprises an opening, a locating tongue covering part of said opening, and a ridge extending along part of said locating tongue, and said other of said joint and lock means comprises a profiled joint component having a free edge slidable along said ridge for bringing said panel into a fully engaged position relative to said sidewall.

7. The card frame of claim 6, wherein said profiled joint component is generally U-shaped, the free edge being formed on one leg of said U-shaped joint component and the other leg slidable along an edge of said locating tongue.

8. The card frame of claim 7, wherein said one leg of said U-shaped joint component is shorter than said other leg.

9. The card frame of claim 8, wherein said locating tongue covers one corner of said opening.

10. The card frame of claim 9, wherein said ridge extends along one side of said locating tongue.

11. The card frame of claim 6, wherein said free end of said ridge is tapered to facilitate insertion of said profiled joint component thereon.

12. The card frame of claim 7, wherein said at least one pair of panels comprises a pair of symmetrical profiled joint components provided at each end of each of said panels for bringing each of said panels into a fully engaged position relative to said sidewalls.

13. The card frame of claim 1, wherein said second joint and lock means comprises an opening, a locating tongue disposed in said opening and a ridge running along said locating tongue.

14. The card frame of claim 13, wherein said first joint and lock means comprises a U-shaped joint component for interfitting with said locating tongue and ridge of said second joint and lock means.

15. The card frame of claim 1, wherein one of said joint and lock means comprises a ramp and the other of said joint and lock means comprises an elastic tongue adapted to be deflected along said ramp during interengagement and abut against an end of said ramp for locking the associated panel and sidewall together.

16. The card frame of claim 15, wherein said one joint and lock means is said second joint and lock means and said other joint and lock means is said first joint and lock means.

17. The card frame of claim 3, wherein the spacing between said guide means of said first series and the spacing between said guide means of said second series are different multiples of the same unitary value.

18. A card frame for circuit cards, said card frame comprising two sidewalls and at least one pair of panels, said sidewalls and said at least one pair of panels being separate molded components, and said panels comprising channels adapted to fit other parts therein, means for assembling said sidewalls and panels together comprising a first joint and lock means integral with said panels and a second joint and lock means integral with said sidewalls, said first and second joint and lock means being cooperable with each other for interengaging and locking in place said sidewalls and panels, and mounting clips for insertion into said channels in said panels, said mounting clips comprising spring members deflectible during insertion and opposing withdrawal when fully inserted.

19. The card frame of claim 18, wherein said channels comprise parts for inserting a tool for releasing said spring members in order to remove said mounting clips.

20. A card frame for circuit cards, said card frame comprising two sidewalls and at least one pair of panels, said sidewalls and said at least one pair of panels being separate molded components, and means for assembling said sidewalls and panels together comprising a first joint and lack means integral with said panels and a second joint and lock means integral with said sidewalls, said first and second joint and lock means being cooperable with each other for interengaging and locking in place said sidewalls and panels, wherein one of said panels and sidewalls is made of plastic.

21. The card frame of claim 20, wherein one of said panels and sidewalls is made of a metal alloy.

22. The card frame of claim 1, wherein said means for receiving a tool comprises frangible zones.

* * * * *